(12) United States Patent
Liu

(10) Patent No.: US 8,989,226 B2
(45) Date of Patent: Mar. 24, 2015

(54) COOLING MODULE FOR LASER, FABRICATING METHOD THEREOF, AND SEMICONDUCTOR LASER FABRICATED FROM THE MODULE

(71) Applicant: Xi'an Focuslight Technologies Co., Ltd., Xi'an, Shaanxi (CN)

(72) Inventor: Xingsheng Liu, Shananxi (CN)

(73) Assignee: Xi'an Focuslight Technologies Co., Ltd., Xi'an, Shaanxi (CN)

( * ) Notice: Subject to any disclaimer, the term of this patent is extended or adjusted under 35 U.S.C. 154(b) by 0 days.

(21) Appl. No.: 14/250,337

(22) Filed: Apr. 10, 2014

(65) Prior Publication Data

US 2014/0204968 A1 Jul. 24, 2014

Related U.S. Application Data

(62) Division of application No. 13/378,294, filed as application No. PCT/CN2010/000647 on May 7, 2010, now Pat. No. 8,737,441.

(30) Foreign Application Priority Data

Aug. 31, 2009 (CN) .......................... 2009 1 0023745
Aug. 31, 2009 (CN) .......................... 2009 1 0023746
Aug. 31, 2009 (CN) .......................... 2009 1 0023748
Aug. 31, 2009 (CN) .......................... 2009 1 0023753

(51) Int. Cl.
*H01S 3/04* (2006.01)
*H01S 5/024* (2006.01)

(52) U.S. Cl.
CPC ................................ *H01S 5/02423* (2013.01)
USPC .............. 372/35; 372/34; 372/36; 372/43.01

(58) Field of Classification Search
CPC ................................................... H01S 5/02423
USPC ......................................... 372/34–36, 43.01
See application file for complete search history.

(56) References Cited

U.S. PATENT DOCUMENTS

| | | | |
|---|---|---|---|
| 5,105,429 A * | 4/1992 | Mundinger et al. ............ | 372/34 |
| 6,643,302 B1 * | 11/2003 | Nishikawa et al. ............. | 372/35 |
| 6,850,549 B2 * | 2/2005 | Takigawa et al. ............... | 372/75 |
| 2006/0045153 A1 * | 3/2006 | Carter et al. .................... | 372/35 |
| 2006/0227827 A1 * | 10/2006 | Kawanishi et al. ............. | 372/36 |
| 2008/0025357 A1 * | 1/2008 | Coleman et al. ................ | 372/36 |
| 2009/0141758 A1 * | 6/2009 | Miyajima et al. ............... | 372/36 |

* cited by examiner

*Primary Examiner* — Yuanda Zhang

(57) ABSTRACT

A cooling module for fabricating a liquid-cooled semiconductor laser, a fabricating method, and a semiconductor laser fabricated from the module are provided, wherein the cooling module for a laser makes use of a liquid cooling plate provided with radiating fins to cool the semiconductor chip. After replacement of the traditional micro-channel structure with the radiating fin structure, the cooling module effectively reduces the resistance to flow of the cooling liquid, remarkably lowers the pressure decrease of the cooling liquid, makes it easier to seal the cooling liquid, provides stronger heat dissipating capability, effectively prolongs the lifetime of the semiconductor laser, and enhances the output power and reliability of the semiconductor laser, alongside the advantages of simple fabrication and low production cost.

7 Claims, 11 Drawing Sheets

COOLING MODULE FOR LASER, FABRICATING METHOD THEREOF, AND SEMICONDUCTOR LASER FABRICATED FROM THE MODULE

CROSS REFERENCE OF RELATED APPLICATION

This is a divisional application of an application having an application number U.S. Ser. No. 13/378,294, filed on Dec. 14, 2011, which is a U.S. National Stage under 35 U.S.C. 371 of the International Application PCT/CN2010/000647, filed May 7, 2010, which claims priority under 35 U.S.C. 119(a-d) to CN 200910023753.3, filed Aug. 31, 2009; CN 200910023748.2, filed Aug. 31, 2009; CN 200910023746.3, filed Aug. 31, 2009; and CN 200910023745.9, filed Aug. 31, 2009.

BACKGROUND OF THE PRESENT INVENTION

1. Field of Invention

The present invention relates to semiconductor lasers, and more particularly to a cooling module for manufacturing a liquid-cooled semiconductor laser, its fabricating method, and a semiconductor laser fabricated from the module.

2. Description of Related Arts

A semiconductor laser is also referred to as the laser diode (LD). Since the eighties of the nineteenth century, technologies in semiconductor physics have been greatly developed. Specifically, new technologies such as the novel structures of the quantum well (QW) and the strained quantum well (SL-QW), refractivity-modulated Bragg transmitter and modulation-enhanced Bragg transmitter, especially, the new techniques of MBE, MOCVD and CBE for the crystal growth and the new technique of epitaxial growth, which can precisely control the crystal growth to the atomic layer thickness, have been developed. By taking advantages of the latest development of technologies, it is possible to grow excellent quantum well materials and strained quantum well materials. As a consequence, the LDs as fabricated had remarkably reduced threshold currency, greatly enhanced conversion efficiency, times-fold increased output power, and apparently elongated lifetime. With the continuing improvements in stability, conversion efficiency and output power of semiconductor lasers, high-power semiconductor lasers have been found in increasingly wider applications in industry, medicine and military, therefore, in great need in the market, and have shown ever broader prospect for future development.

With the continuing and rapid development of the more and more applications of lasers, stricter and stricter requirements, by the various fields, have been raised to high-power semiconductor lasers, requiring them to be further improved in terms of output light power, conversion efficiency, reliability and performance stability. In addition to the chips, the performance of lasers is related to heat dissipation and packaging. In order to improve reliability and performance stability, and to lower production cost of lasers, highly reliable packaging structures and highly effective heat-dissipating structures, as well as simplicity and low cost, have always been pursued in the design and manufacture of semiconductor lasers.

Currently, there are two packaging modes for high-power single-array semiconductor layers, i.e. thermal-conduction cooling type (Michael Leers, Konstantin Boucke, Manfred Gotz, et al., *Thermal resistance in dependence of diode laser packages*, In: Mark S. Zediker eds. Proceedings of 56 SPIE, 2008. 6876 (687609)) and micro-channel liquid cooling type (Rushikesh M. Patel, David K. Wagner, Allen D. Danner, Kam Fallahpour, Richard S. Stinnett, *"Use of micro-channel cooling for high-power two-dimensional laser diode arrays"*, SPIE, vol. 634:466-474 (1992)).

While working under the mode of continuous wave, a laser of thermal-conduction cooling type shall have a large block heat sink. Since a passive heat-dissipating mode is employed, this kind of laser tends to have temperature rising, which, in turn, leads to wavelength shift of the laser and reduction in lifetime and reliability of the laser. Consequently, its output power is usually a mere tens of watts. The passive heat-dissipating mode makes it very difficult for the power output of the semiconductor laser to rise from tens of watts to hundreds of watts.

The micro-channel liquid cooling type has currently been in commercial production. Although active heat dissipation is employed in this type of laser to have enhanced the heat-dissipating capability and greatly increase the power output of the laser, it has the following defects:

1. High Costs in Use and Maintenance

A micro-channel liquid cooler needs to use deionized liquid as cooling liquid in order to prevent the positive and negative electrodes from electric conduction. Moreover, low electrical conductivity of the deionized liquid must be maintained throughout the period of use, so that the costs in use and maintenance are very high.

2. Difficulty in Processing

The micro-channel liquid cooler is usually formed by copper materials, which are made by stacking several very thin layers of copper sheets one on the other. The inner diameter of the micro through-channel is about 300 microns. During the processing the micro-channel liquid cooler, each layer of copper sheets should be finely processed, so as to create a turbulent flow with high heat-dissipating capability when the liquid flows through the stacked micro through-channel. But, the fine processing of the micro-channel cooler is a difficult task.

3. High Production Cost

Since the fine processing of the micro-channel cooler is considerably difficult, the production cost thereof is correspondingly very high.

4. Short Lifetime

During the process of operation of the laser, if impurities are present in the cooling medium (which is usually deionized liquid), these impurities tend to attach on the inner wall of the micro channel. On the one hand, particles of these impurities might block the liquid passage of the micro-channel cooler to thereby reduce the cooling effect, thus generating relatively severe heat concentration that leads to shift of the output wavelength of the laser, broadening of the spectrum, reduction in performance reliability and lifetime, and in extreme case, even to burn out the laser. On the other hand, particles of these impurities would cause electrochemical erosion of the wall of the micro channel, and might erode away the wall of the micro-channel cooler in some cases, thus severely affecting the safety of the laser. All these seriously and adversely affect the lifetime of the laser.

5. High Requirement on Sealing

Since the cooling medium flows in a very restricted space inside the micro-channel cooler, undesired pressure decrease is easily generated, whereby flow resistance of the cooling medium is high and sealing is difficult.

In view of the above problems, it is apparent that currently available liquid-cooled lasers as those discussed above are yet to be improved due to inconveniences and deficiencies in structure, in manufacture, and in use. To solve the aforementioned problems in the prior-art liquid-cooled lasers, manufacturers concerned tried their best to research for better solutions, but none of the designs, which have been developed and completed, has been found applicable until now for long. Solutions to these problems have been eagerly sought by those concerned. Therefore, it is indeed one of the important tasks of research and development, as well as an objective in urgent need for improvement in the art, to design a practical, conveniently maintainable, structurally simple, manufacture cost-effective liquid-cooling laser.

In view of the aforementioned defects present in currently available liquid-cooling lasers, the present inventor based on his experiences and professional knowledge acquired through years-long design and fabrication of such products, actively studied, constantly innovated and applied relevant theories, tried to create a novel-structured, and improved liquid-cooling laser with practical applicability. After incessant researches, designs, repeated trail productions of samples, and improvements, the present practically valuable invention has been finally made.

SUMMARY OF THE PRESENT INVENTION

Aiming at overcoming the defects inherent in currently available liquid-cooling lasers, a primary objective of the present invention is to provide a novel-structured cooling module used in a liquid-cooling laser, a fabricating method thereof, and a semiconductor laser fabricated from such a module. The technical problems to be solved are to lower production cost, to reduce thermal resistance of such a semiconductor laser while the requirement of use power are satisfied, to remove the difficulty of unduly large pressure decrease of the cooling medium, and to guarantee high output power of the laser on condition that the beam quality is satisfied.

The objective of and technical problems solved by the present invention are realized by use of the following technical solutions.

Proposed according to the present invention is a cooling module for a laser, which includes a connection plate and a liquid cooling plate. Fixing holes are provided perpendicularly at central portions of the connection plate and the liquid cooling plate. Liquid inlets and liquid outlets are provided respectively at both adjacent sides of the fixing holes. A radiating fin is provided within the liquid inlet of the liquid cooling plate. A chip mounting area is reserved at one end of the liquid cooling plate close to the liquid inlet thereof. A heat sink and a chip are provided at the chip mounting area of the liquid cooling plate, with the heat sink attaching to a positive electrode surface of the chip, and a negative electrode surface of the chip attaching to the connection plate. An insulating plate is further provided between the connection plate and the liquid cooling plate.

The cooling module for a laser as proposed in the present invention is further realized by use of the following technical means.

In the aforementioned cooling module for a laser, the liquid cooling plate, having a thickness of 1.6 mm, is made of metal, ceramic, diamond, or a composite material of copper and diamond.

In the aforementioned cooling module for a laser, the fixing hole has a diameter of 3.5 mm, the liquid inlet has a diameter of 5.5 mm, and the liquid outlet has a diameter of 5.5 mm.

In the aforementioned cooling module for a laser, the radiating fins of the liquid cooling plate are a plurality of metal leaves or honeycomb-shaped liquid cooling checks fixed inside the liquid inlet.

The present invention further provides a method for fabricating the aforementioned cooling module for a laser. The method includes the following steps of:

1) first making a liquid cooling plate into a rectangular plate, polishing the surface of the liquid cooling plate, and providing a fixing hole and a liquid outlet thereon;

2) providing a liquid inlet and radiating fins on the liquid cooling plate, and reserving a chip mounting area at an end of the liquid cooling plate close to the liquid inlet;

3) providing sink holes at upper ends of the liquid outlet and the liquid inlet, thus completing fabrication of the liquid cooling plate;

4) cleaning and drying the liquid cooling plate, thereafter electroplating the liquid cooling plate to prevent corrosion; and 5) using a die bonding process to bond a positive electrode of a chip onto a heat sink by way of soldering with a hard solder; then soldering together the heat sink, the chip and an insulating plate with a micro liquid cooling plate and a copper connection plate using a reflow soldering process; or connecting the chip with the liquid cooling plate with a soft solder if there is no step in the chip mounting area of the liquid cooling plate.

The present invention further proposes a single-bar semiconductor laser using the aforementioned cooling module. The laser comprises a cooling module with a chip, an upper liquid cooling block, a positive electrode connection plate, a connection plate fixing plate, and a lower liquid cooling block, wherein the lower liquid cooling block, the cooling module and the upper liquid cooling block are connected to one another by stacking in the order from bottom to the top. A step is provided at one side of an upper surface of the lower liquid cooling block, and a positive electrode connection plate having a liquid outlet and a connection plate fixing plate having a liquid outlet are provided on the step. Corresponding to the fixing hole, the liquid inlet and the liquid outlet of the cooling module, a fixing hole, a liquid inlet and a liquid outlet on the lower cooling block are respectively provided. Corresponding to the fixing hole, the liquid inlet and the liquid outlet of the cooling module, a fixing hole, a liquid inlet and a liquid outlet of the upper cooling block and a communication hole communicating the upper cooling block liquid inlet and the upper cooling block liquid outlet are respectively provided on the upper liquid cooling block. The cooling module and the upper liquid cooling block and the lower liquid cooling block at the upper or lower sides of the cooling module are fixed together into an integrity, by a bolt passing through the fixing holes on the lower liquid cooling block and the cooling module to be screwed into a threaded hole on the bottom of the upper liquid cooling block. The liquid inlet of the lower cooling block, the liquid inlet of the cooling module and the liquid inlet of the upper cooling block form a liquid inflow passage, and the liquid outlet of the upper cooling block, the liquid outlet of the cooling module, the liquid outlet of the positive electrode connection plate, the liquid outlet of the connection plate fixing plate, and the liquid outlet of the lower cooling block form a liquid outflow passage.

In the aforementioned single-bar semiconductor laser, the liquid inlet of the lower liquid cooling block consists of a lower liquid inlet, a middle transition stepped hole and an upper expanded hole, and a seal ring is provided at an orifice of the upper expanded hole.

The present invention further proposes a horizontal array type semiconductor laser using the aforementioned cooling module. The laser comprises a lower liquid cooling block, a positive electrode connection plate, a negative electrode connection plate, an upper liquid cooling block, and two or more cooling modules provided with fixing holes, liquid inlets, liquid outlets and chips arranged in parallel, wherein the lower liquid cooling block is provided therein with a horizontal liquid inlet and a horizontal liquid outlet; two or more sets of liquid inlets and outlets are provided at the upper surface of the lower liquid cooling block, each set including a vertical liquid inlet and a vertical liquid outlet, of which the vertical liquid inlet is communicative with the horizontal liquid inlet of the lower liquid cooling block, and the vertical liquid outlet is communicative with the horizontal liquid outlet of the lower liquid cooling block; the two or more cooling modules provided with liquid inlets and liquid outlets are disposed in parallel corresponding to each set of liquid inlets and liquid outlets on the upper surface of the lower liquid cooling block, and the liquid inlet and the liquid outlet of each cooling module are respectively communicative with the each set of the vertical liquid inlet and the vertical liquid outlet of the lower liquid cooling block; a positive electrode connection plate is provided between each cooling module and the lower liquid cooling block, and a negative electrode connection plate is provided on each cooling module; the upper liquid cooling block is above the negative electrode connection plate; a bolt through-hole corresponding to the fixing hole at the central portion of the cooling module is provided on the negative electrode connection plate; a group of vertical bolt through-holes matching the corresponding fixing holes of the cooling modules is provided on the lower cooling block; a return-liquid communication hole is provided in the upper liquid cooling block; a liquid inlet and a liquid outlet are provided on a lower surface of the upper liquid cooling block, and the liquid inlet and the liquid outlet of the upper liquid cooling block are communicative with the return-liquid communication hole; a fixing screw hole is further provided on the lower surface of the upper liquid cooling block; the lower liquid cooling block, the cooling module and the negative electrode connection plate are fixed on the upper liquid cooling block via a bolt.

The horizontal array type semiconductor laser as proposed in the present invention can be further realized by use of the following technical means.

In the aforementioned horizontal array type semiconductor laser, the negative electrode connection plate and the positive electrode connection plate, which are respectively provided at the upper and lower sides of each cooling module, are both fixed in insulation on the lower liquid cooling block, wherein the negative electrode connection plate of each cooling module is connected with the positive electrode connection plate of the adjacent cooling module, thus that each set of negative electrode connection plate and positive electrode connection plate at upper and lower sides of each cooling module forms a serially electrically connected form, the negative electrode connection plate is lead out by a negative electrode leading plate, and the positive electrode connection plate is lead out by a positive electrode leading plate.

In the aforementioned horizontal array type semiconductor laser, a sink groove is provided at an upper opening of the vertical liquid inlet on the lower liquid cooling block, and a liquid-tight seal ring is provided on the sink groove.

The present invention still provides a stacked array type semiconductor laser using the aforementioned cooling module. The laser comprises a lower bottom plate, a positive electrode block, a multi-bar serially connected module set, a negative electrode block, an upper pressing block, and a liquid cooling block stacked in the order from bottom up, wherein the multi-bar serially connected module set is formed by sequentially and perpendicularly stacking a plurality of cooling modules having chips and provided with liquid inlets and liquid outlets; the liquid inlets and liquid outlets on the cooling modules form a liquid inflow passage and a liquid outflow passage of the multi-bar serially connected module set; the positive electrode block is provided with a positive electrode block liquid inlet and a positive electrode block liquid outlet thereon; the negative electrode block is correspondingly provided with a negative electrode block liquid inlet and a negative electrode block liquid outlet; the upper pressing block is provided with a liquid inlet and a liquid outlet thereon; the liquid cooling block is provided with a liquid cooling block liquid inlet and a liquid cooling block liquid outlet thereon; the positive electrode block liquid inlet, the liquid inflow passage of the positive electrode block, the negative electrode block liquid inlet, the liquid inflow passage of the negative electrode block, and the liquid cooling block liquid inlet are sequentially communicative with one another; the positive electrode block liquid outlet, the liquid outflow passage of the positive electrode block, the negative electrode block liquid outlet, the liquid outflow passage of the negative electrode block, and the liquid cooling block liquid outlet are sequentially communicative with one another; the lower bottom plate is correspondingly provided with a lower bottom plate liquid inlet and a lower bottom plate liquid outlet; and side plates are provided at both sides of the lower bottom plate; the positive electrode block, the multi-bar serially connected module set and the negative electrode block are arranged between the two side plates standing up on the lower bottom plate after having been sequentially stacked and mounted; the upper pressing block is disposed at an upper side of the negative electrode block and is fixedly connected with the two side plates of the lower bottom plate; an upper side face of the upper pressing block is fixedly connected with the liquid cooling block; a communication hole is provided in the liquid cooling block, the liquid cooling block liquid inlet and the liquid cooling block liquid outlet are communicative at one end with each other via the communication hole and another end thereof is respectively connected with the liquid inlet and the liquid outlet of the upper pressing block; and the lower bottom plate, the positive electrode block, the multi-bar serially connected module set, the negative electrode block and the upper pressing block are connected together in the form of a stacked array via a bolt centrally passing therethrough.

In the aforementioned stacked array type liquid-cooled semiconductor laser, an H-shaped rear plate is fixedly connected at a side of the two side plates of the lower bottom plate, which is farer away from a light emitting surface.

The present invention possesses apparent advantages and advantageous effects in comparison with prior art technology. By virtue of the technical solutions discussed above, the cooling module for a laser, the semiconductor laser fabricated from this module, and the fabrication method thereof according to the present invention achieve considerable technical progress and practical applicability, are highly valued for widely industrial applications, and possess, at least, the advantages specified below.

1. The cooling module for a laser and the semiconductor laser fabricated from this module according to the present invention are structurally simple and convenient in operation and maintenance. Because of not adopting micro-channel structure but a radiating fin structure in the liquid cooling plate, the restriction of the size of the particles in the cooling liquid is not highly required. Merely industrial water meets the requirement of normal operation. Moreover, it is easy to mechanically process the cooling module for a laser and the semiconductor laser fabricated from this module, and the production cost is relatively lower, whereby the cost can be greatly lowered while economic efficiency is greatly enhanced. In terms of practical applicability and cost effect, the laser meets, by all means, the requirement for industrial development and is highly valued for industrial application.

2. The cooling module for a laser and the semiconductor laser fabricated from this module according to the present invention have great heat-dissipating capabilities. The use of liquid cooling and the use of a plurality of radiating fins in liquid passages to dissipate heat make it possible to greatly increase in the heat-dissipation space of the liquid cooling plate, and creates stronger turbulence of the cooling medium, thereby strengthening the cooling effect of the liquid cooling plate. Meantime, flowing space of the cooling medium is also increased, thereby achieving the functions of reducing flow resistance, reducing pressure decrease, reducing thermal resistance of the device and enhancing heat dissipation performance.

3. The cooling module for a laser and the semiconductor laser fabricated from this module according to the present invention are highly reliable. Since the size of the water passage is greatly enlarged in comparison with the size of the micro-channel structure, the risk for the cooling liquid passage to be corroded is relatively low, hence reliability being greatly enhanced.

4. The cooling module for a laser and the semiconductor laser fabricated from this module according to the present invention have less strict requirements on sealing. Replacement of micro channel in the prior-art with the radiating fins of the present invention greatly increases the flowing space for the cooling medium, and this, in turn, reduces the flow resistance and the pressure decrease, so that the requirement on sealing is consequently reduced.

5. The cooling module for a laser and the semiconductor laser fabricated from this module according to the present invention make it possible that the power output of the laser and the liquid cooling capability completely satisfies the operating requirements of low duty-ratio quasi-continuous wave, and the said laser realizes high power output.

6. The positions of its inlet and outlet of the cooling medium of the semiconductor laser according to the present invention are changeable. They can be optionally designed to locate on the same end surface or on two different end surfaces, or on each end of the positive and negative electrode blocks.

7. The horizontal array type semiconductor laser according to the present invention employs the active heat dissipation mode, whereby the liquid directly rushes to the bottom of the heat-generating section of the laser, namely, the heat sink, to quickly carry away the heat, thus greatly enhancing the heat dissipating capability of the array laser. The good heat dissipating capacity makes easy to raise the power, in necessity, to meet the requirement on high power as demanded by the lateral pump or special purposes of application. Since the fabrication process adopts individually packaging and assembling each laser (with a cooling module having its chip), each laser can be separately fabricated and is independent from others. If a single laser is damaged, it can be immediately replaced without affecting other lasers from normal operation, hence reducing the cost of operation of the entire horizontal array laser. The number of lasers of the horizontal array can be multiplied, thus making it possible to achieve even higher laser power output, and making possible the operation under the continuous wave (CW) mode and the quasi-continuous wave (QCW) mode.

8. The stacked array type semiconductor laser according to the present invention realizes high power laser output. The reason is because a structure of a plurality of stacked and chip-embedded cooling modules is used, therefore, its liquid cooling capability completely satisfying the operating requirements of low duty-ratio quasi-continuous wave. Consequently, it realizes high power laser output.

In summary, the cooling module for a laser, the semiconductor laser fabricated from this module, and the fabrication method thereof according to the present invention possess the aforementioned various advantages and practical values. They are greatly improved in terms of structures and functions, represent remarkable technical progress, produce useful and practical effects, and have many improved and prominent efficiencies as compared with prior-art semiconductor lasers. Because of these, they suit, well, the operation and are valued for wide and various industrial applications. The present designs are, indeed, novel, progressive and practical.

The above description is merely directed to a generalization about the technical solutions of the present invention. In order to make clearer the technical means of the present invention for implementation according to the contents of the Description, and to make, more apparent and comprehensible, the above and other objectives, characteristics and advantages of the present invention, preferred embodiments are particularly provided below for detailed explanation with reference to the accompanying drawings.

DETAILED DESCRIPTION OF THE PREFERRED EMBODIMENT

To further enunciate the technical means and effects employed by the present invention to achieve the predetermined inventive objectives, the cooling module for a laser, the fabrication method thereof, the semiconductor laser fabricated from the module as proposed in the present invention, as well as their specific embodiments, structures, features and effects are described in greater details below with reference to the accompanying drawings and preferred embodiments.

The aforementioned solutions and other technical contents, features and effects of the present invention will become clearer by the following detailed description with reference to the preferred embodiments illustrated in the accompanying drawings. By the description of the specific embodiments it is possible to get further and specified comprehension about how the technical means employed and effects achieved by the present invention and how to realize the predetermined inventive objectives. However, the accompanying drawings herein included are merely directed to providing references and explanations, and shall not be used to restrict the present invention.

Figure 1:
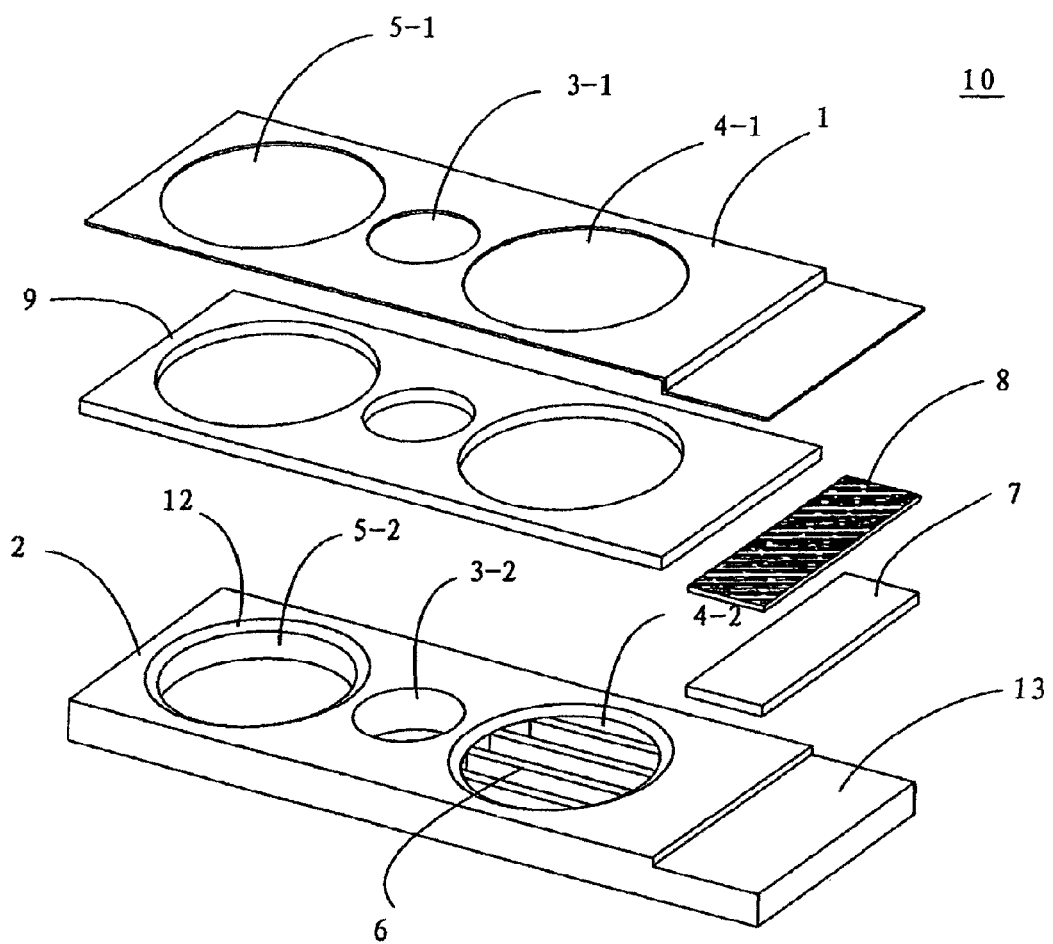
FIG. 1 is a three-dimensional exploded view showing the outer appearance of the assembling structures of the cooling module according to the present invention.
Figure 2:
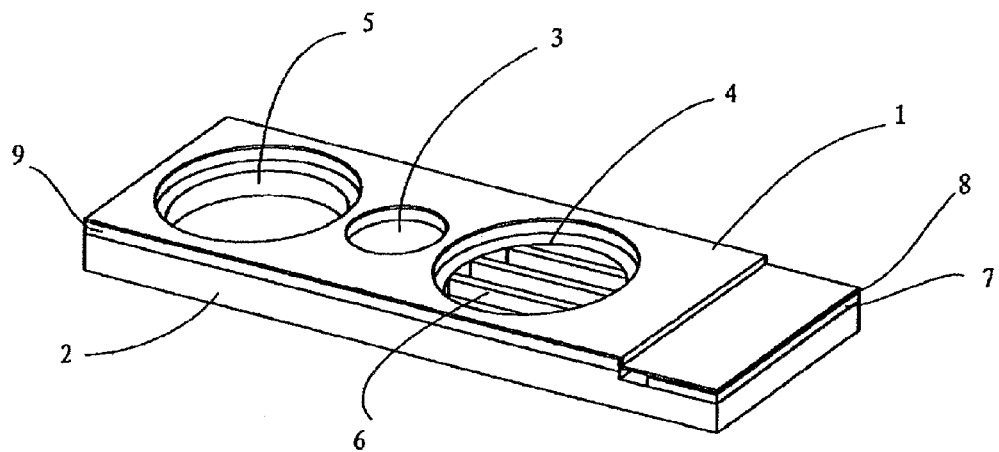
FIG. 2 is a three-dimensional schematic view showing the outer appearance of the assembling structures of the cooling module according to the present invention.

Referring to FIGS. 1 and 2, a cooling module 10 for a laser according to a preferred embodiment of the present invention mainly includes a connection plate 1 and a liquid cooling plate 2 stacked with the connection plate 1. Fixing holes 3 are provided vertically at central portions of the mutually stacked connection plate 1 and liquid cooling plate 2 (the one on the connection plate 1 is the fixing hole 3-1, and the one on the liquid cooling plate 2 is the fixing hole 3-2), and liquid inlets 4 (4-1, 4-2) and liquid outlets 5 (5-1, 5-2) are provided, respectively, at both sides of the fixing holes 3. A radiating fin 6 is provided within the liquid inlet 4-2 of the liquid cooling plate 2, and a chip mounting area is provided at one end of the liquid cooling plate 2 close to the liquid inlet 4 of the liquid cooling module. Specifically, the chip mounting area is a processed step 13. A heat sink 7 and a chip 8 are provided on the chip mounting area of the liquid cooling plate, wherein the heat sink 7 attaches to the positive electrode surface of the chip 8, and the negative electrode surface of the chip 8 attaches to the connection plate 1. An insulating plate 9 is further provided between the connection plate 1 and the liquid cooling plate 2. The heat sink 7 may optionally be eliminated, in which case there is no need to provide any step at the chip mounting area, and consequently the positive electrode surface of the chip 8 directly attaches to the liquid cooling plate 2. Whether a heat sink should be provided is decided on the desires of the user.

Figure 3:
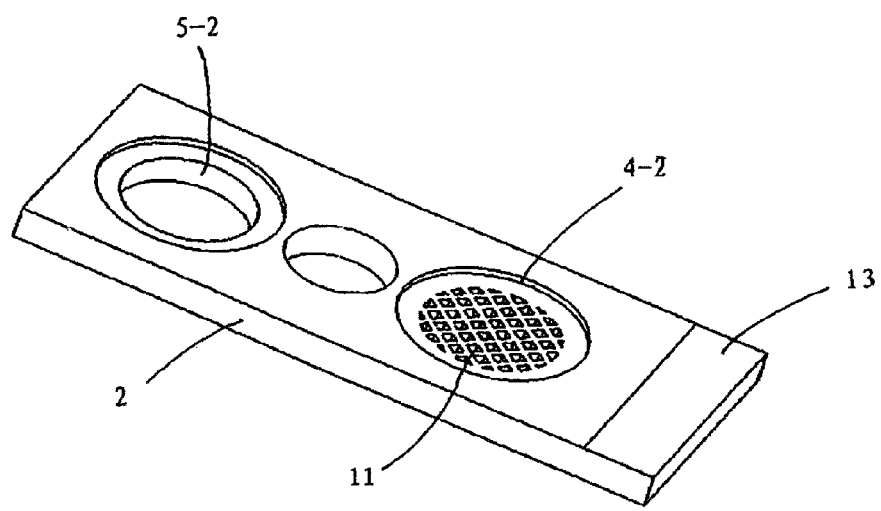
FIG. 3 is a three-dimensional schematic view showing the honeycomb-shaped radiating flakes of liquid cooling plate of the cooling module according to the present invention.
Figure 4:
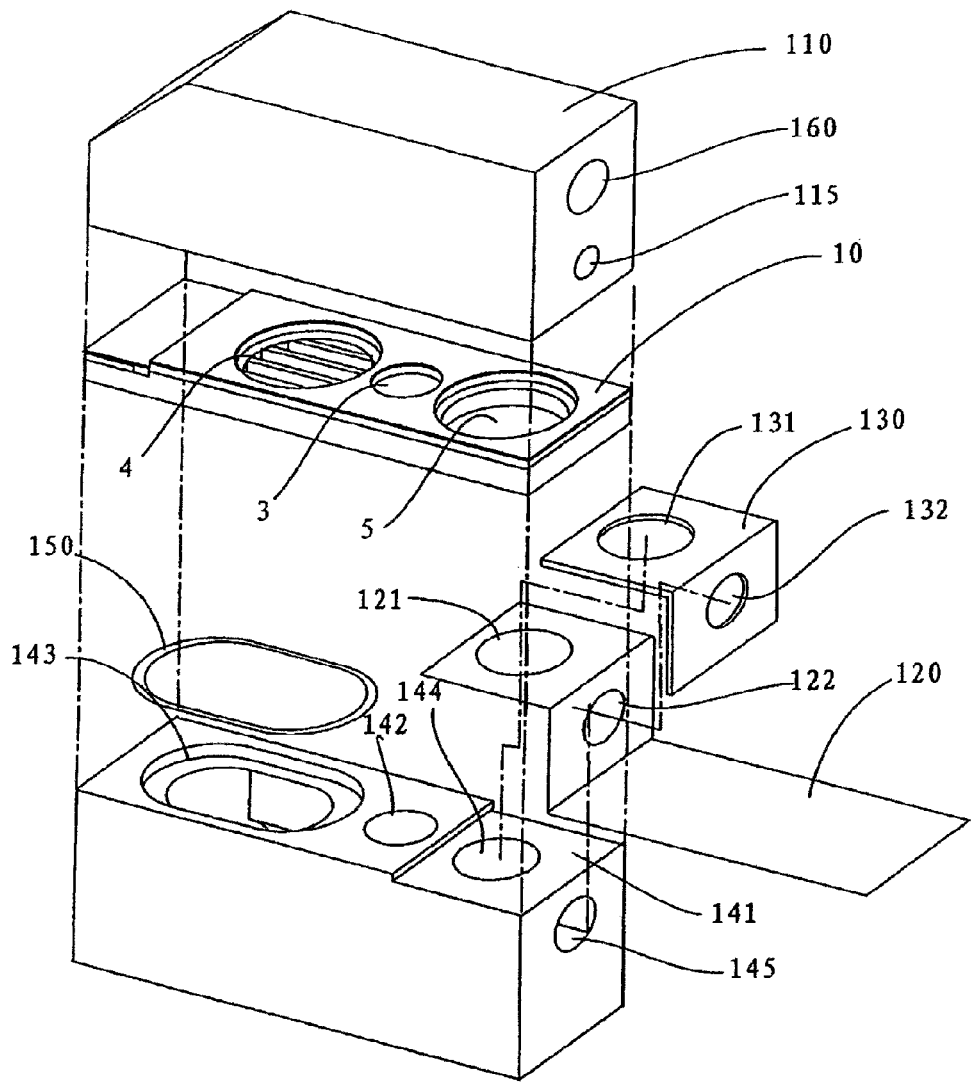
FIG. 4 is a three-dimensional exploded view showing the single-bar semiconductor laser according to the present invention.

The liquid cooling plate 2 is of a rectangular plate shape, and may also be designed as any other shapes, like a polygonal shape, as practically demanded. The fixing hole 3-2 at the central portion of the liquid cooling plate 2 has a diameter of 3.5 mm. The thickness of the liquid cooling plate 2 is controlled at 1.6 mm. The liquid inlet 4-2 has a diameter of 5.5 mm, and the liquid outlet 5-2 has a diameter of 5.5 mm. The radiating fin 6 disposed inside the liquid inlet 4-2 is a plurality of metal leaves radially fixed into the liquid inlet 4-2 (as shown in FIG. 2), and the number thereof can be plurality, for example, three leaves. The radiating fin 6 can either be integrally processed with the liquid inlet 4-2 or subsequently fixed onto the inside of the liquid inlet 4-2. The structure of the radiating fin 6 is not restricted to the one type of metal leaves, as it may, optionally, be honeycomb-shaped liquid cooling checks 11 disposed inside the liquid inlet 4-2 (as shown in FIG. 3).

The heat sink 7 is made of a material having good thermal conductivity. Thus even although additional heat dissipating path of the chip 8 may be added, the phenomenon of thermal stress concentration, which is due to mismatch of thermal expansion coefficients caused by directly soldering the chip 8 onto the liquid cooling plate 2, is removed to a considerable extent.

To facilitate the placement of a seal ring, a sink hole 12 having a diameter larger than that of the liquid inlet 4-2 and that of the liquid outlet 5-2 is provided at the upper end of the liquid inlet 4-2 and the upper end of the liquid outlet 5-2. A seal ring 13 is provided in the sink hole 12, so as to guarantee the performance of sealing between the liquid cooling plate and other component parts during formation of the semiconductor laser. The shapes of the liquid inlet 4-2 and the liquid outlet 5-2 according to the present invention is round (as shown in FIG. 1), or other shapes which suit the circulation of the cooling liquid, for example, polygonal and elliptical shapes.

The material of the liquid cooling plate 2 can be selected from such metals having good thermally conducting capabilities as copper and aluminum, and can also be selected from ceramic, diamond or other composite materials, for instance, a composite material of copper with diamond. Moreover, the surface of the liquid cooling plate 2 can be coated with an anticorrosion layer.

The present invention further provides a method for fabricating the aforementioned cooling module for a laser. The method includes the following steps of:

1) first processing a liquid cooling plate into a rectangular plate, polishing the surface of the liquid cooling plate, and providing a fixing hole and a liquid outlet thereon;

2) processing a liquid inlet and a radiating fin on the liquid cooling plate, and reserving for a chip mounting area at an end of the liquid cooling plate close to the liquid inlet;

3) processing a sink hole at upper end of the liquid outlet and a sink hole at upper end of the liquid inlet, thus completing fabrication of the liquid cooling plate;

4) electroplating the liquid cooling plate after cleaning and drying thereof to prevent corrosion; and 5) soldering a positive electrode (p surface) of a chip onto a heat sink with a hard solder (an alloy of gold and tin) using a die bonding process; then soldering together the heat sink, the chip and an insulating plate with a micro liquid cooling plate and a copper connection plate using a reflow soldering process; and connecting the chip with the liquid cooling plate with a soft solder if there is no step in the chip mounting area of the liquid cooling plate.

Referring to FIGS. 1, 4, 5, 6 and 8, a single-bar semiconductor laser using the aforementioned cooling module 10 as proposed in the present invention includes a cooling module 10 with a chip, an upper liquid cooling block 110, a positive electrode connection plate 120, a connection plate fixing plate 130, and a lower liquid cooling block 140. The lower liquid cooling block 140, the cooling module 10 and the upper liquid cooling block 110 are connected to one another by stacking in the order from bottom up. A step 141 is provided at one side of an upper surface of the lower liquid cooling block 140, and the positive electrode connection plate 120 having a liquid outlet 121 and the connection plate fixing plate 130 having a liquid outlet 131 are provided on the step 141. Corresponding to the fixing hole 3, the liquid inlet 4 and the liquid outlet 5 of the cooling module 10, a fixing hole 142, a liquid inlet 143 and a liquid outlet 144 are respectively provided on the lower liquid cooling block 140. Corresponding to the fixing hole 3, the liquid inlet 4 and the liquid outlet 5 of the cooling module 10, a fixing screw hole 111, an liquid inlet 112, an liquid outlet 113, and a communication hole 114 communicating the upper cooling block liquid inlet 112 and the upper cooling block liquid outlet 113 are respectively provided on the upper liquid cooling block 110. The cooling module 10 and the upper liquid cooling block 110 at the upper side of the cooling module 10 and the lower liquid cooling block 140 at the lower side of the cooling module 10 are fixed together as an integrity by a bolt passing through the fixing hole of the lower liquid cooling block 140 and the fixing hole of the cooling module 10 to be screwed into the threaded hole 111 in the upper liquid cooling block 110. The liquid inlet 143 of the lower cooling block, the liquid inlet 4 of the cooling module 10 and the liquid inlet 112 of the upper cooling block 110 form a liquid inflow passage. The liquid outlet 113 of upper cooling block 110, the liquid outlet 5 of the cooling module 10, the liquid outlet 121 and the liquid outlet 131 of the positive electrode connection plate 120 and the connection plate fixing plate 130, and the liquid outlet 144 of the lower cooling block 140 form a liquid outflow passage.

The liquid inlet 143 of the lower liquid cooling block 140 consists of a lower liquid inlet 1431, a middle transition stepped hole 1432 and an upper expanded hole 1433. A seal ring 150 is provided at an orifice of the upper expanded hole 1433, to ensure excellent sealing of the liquid inflow passage. To achieve excellent sealing effect, it is desirable to provide seal rings between each pair of the liquid inlets and outlets, for instance, between the liquid inlet 4 and the liquid inlet 112, between the liquid outlet 144 and the liquid outlet 121, between the liquid outlet 121 and the liquid outlets 5, between the liquid outlet 5 and the liquid outlet 113, etc. so as to achieve excellent sealing effect of the entire liquid inflow passage and the liquid outflow passage.

The positive electrode connection plate 120 is fixed by the connection plate fixing plate 130 to a screw hole 145 on one side of the lower liquid cooling block 140 via a fixing hole 122 and a fixing hole 132 provided at sides of the positive electrode connection plate 120 and the connection plate fixing plate 130 by means of a screw. Provided at the side of the upper liquid cooling block 110 is a negative electrode connection hole 113, which is a threaded hole and leads out the negative electrode by using a screw. Provided at the side of the upper liquid cooling block 110 and at a port of the communication hole is a sealing plug 160.

The novel single-bar liquid-cooled laser according to the present invention is fabricated as discussed below.

Figure 5:
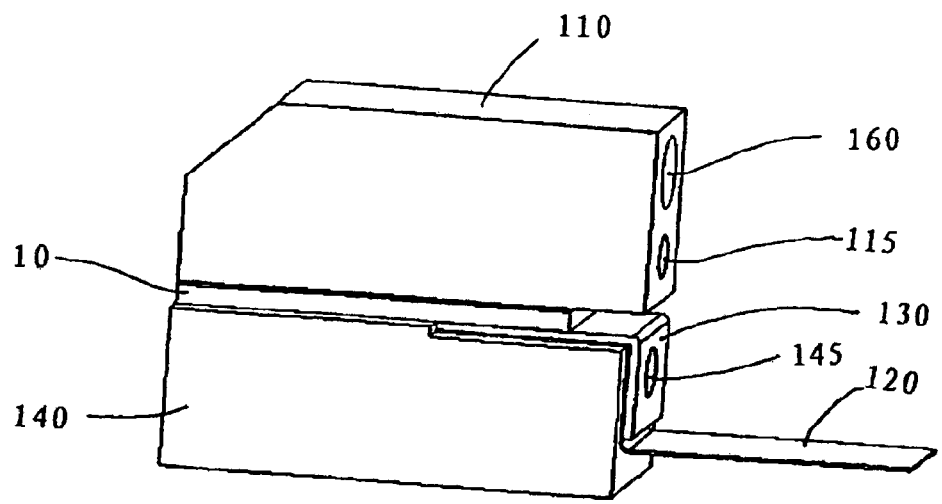
FIG. 5 is a three-dimensional view showing the single-bar semiconductor laser according to the present invention.
Figure 6:
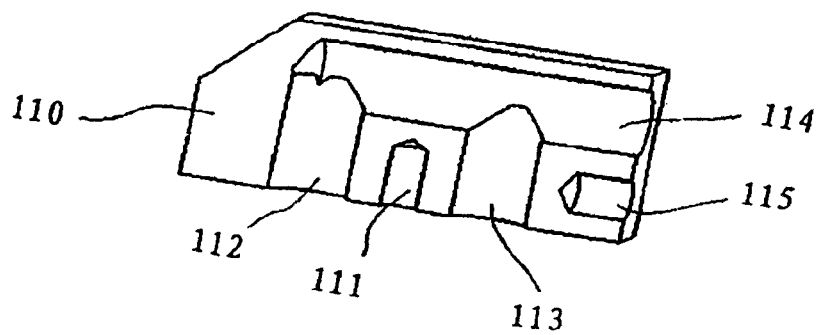
FIG. 6 is a sectional view showing the upper liquid cooling block of the single-bar semiconductor laser according to the present invention.
Figure 7:
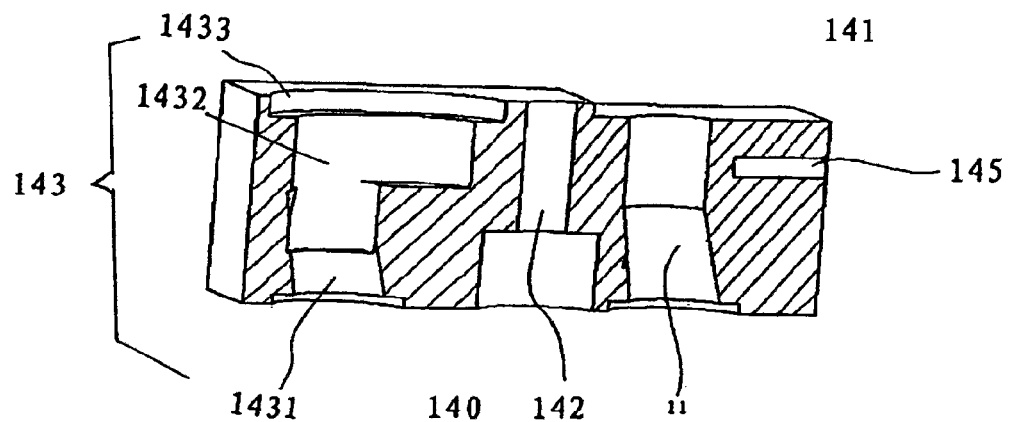
FIG. 7 is a sectional view showing the lower liquid cooling block of the single-bar semiconductor laser according to the present invention.

1) As shown in FIGS. 5 and 7, the upper liquid cooling block 110 and the lower liquid cooling block 140 are made by drilling holes on a copper block.

2) The seal rings 150 are placed, respectively, at outer rings of the upper ports of the liquid inlet 143 and the liquid outlet 144 of the lower liquid cooling block 140, at the liquid inlet 4 and the liquid outlet 5 of the cooling module 10, and at outer rings of the lower ports of the liquid inlet 112 and the liquid outlet 113 of the upper liquid cooling block 110, and the lower liquid cooling block 140, the cooling module 10, and the upper liquid cooling block 110 are stacked one on the other from bottom up.

3) A connection bolt is used to sequentially pass through the fixing holes at the central portions of the lower liquid cooling block 140 and the cooling module 10 to be screwed into the threaded hole 111 on the upper liquid cooling block 110, whereby the component parts are closely connected to one another, thus forming the single-bar liquid-cooled laser according to the present invention.

The working principle of this embodiment is as follows.

During operation, the positive electrode connection plate 120 and the negative electrode connection hole 113 are applied with voltage. The chip 8, preferably embodied as a laser chip, normally operates, and the heat generated during operation is carried away via circulatory flow of the cooling liquid. The cooling liquid enters via the liquid inlet 146 of the lower liquid cooling block 140 (as shown in FIG. 7), and passes through a liquid inflow passage transition section 147 into the liquid inlet 143 and then into the liquid inlet 4 of the cooling module 10. The cooling liquid forms a turbulent flow within the liquid inlet 143 of the lower liquid cooling block 140. The liquid inlet 143 is filled full of the cooling liquid, and most of the heat generated by the chip 8 is carried away directly from the lower surface of the liquid cooling plate 2 in the cooling module 10 attaching to the chip 8. The residual heat generated by the chip 8 is transmitted to the radiating fin 6 through the liquid cooling plate 2, and the cooling liquid is rushed onto the liquid cooling plate 2 and the radiating fin 6, carrying away the heat from the radiating fin 6. Subsequently, the cooling liquid sequentially passes through the insulating plate 9, and the connection plate 1 into the liquid inlet 112 of the upper liquid cooling block 110, into the liquid outlet 113 via a connection hole 115, then through the liquid outlet 5 of the cooling module 10, and is finally expelled out via the liquid outlet 114 of the lower liquid cooling block 140. After the heat has been dissipated by a water cooler, the cooling liquid reenters the liquid inlet 146. The cooling liquid is completely sealed in the liquid inflow passage and the liquid outflow passage to prevent leakage of coolant from damaging the semiconductor laser.

Besides the aforementioned structure of the inlet and outlet locations of the cooling medium according to the present invention, it is also possible to adopt the circulation of liquid inflow and outflow into and out of the upper liquid cooling block, only. Also possible is to design the inlet and outlet locations of the cooling medium at the two ends of the upper and lower liquid cooling blocks, in which case the cooling liquid flows unidirectionally into the laser. The specific circulation form of the cooling liquid should be flexibly decided by the mounting mode of the laser and the settings of external fittings. The upper liquid cooling block and the negative electrode block according to the present invention can either be integrated with each other or independent of each other.

According to the laser structure of the present invention, an 808 nm, 250 W single-array liquid-cooling semiconductor laser is fabricated, whose various test results are given below.

Figure 8:
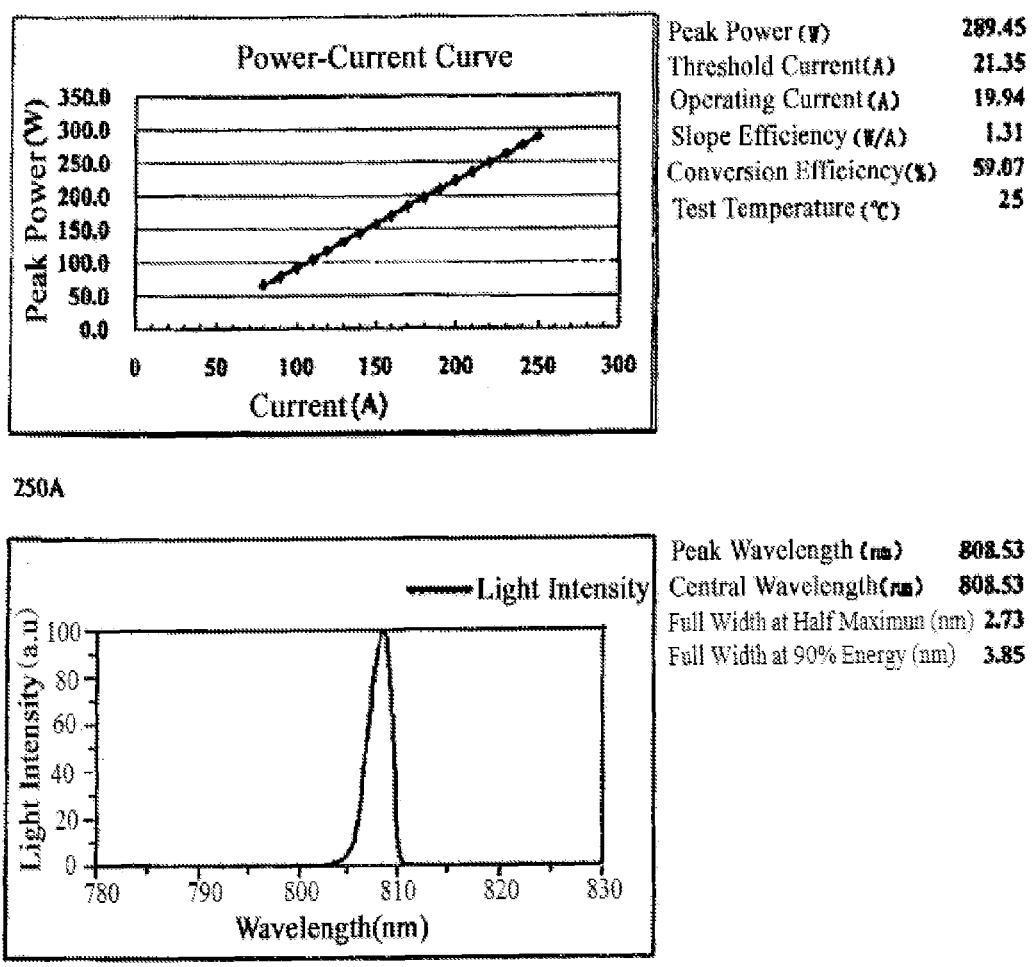
FIG. 8 is a chart showing P-I curve of a single-bar 808 nm semiconductor laser sample according to the present invention.
Figure 9:
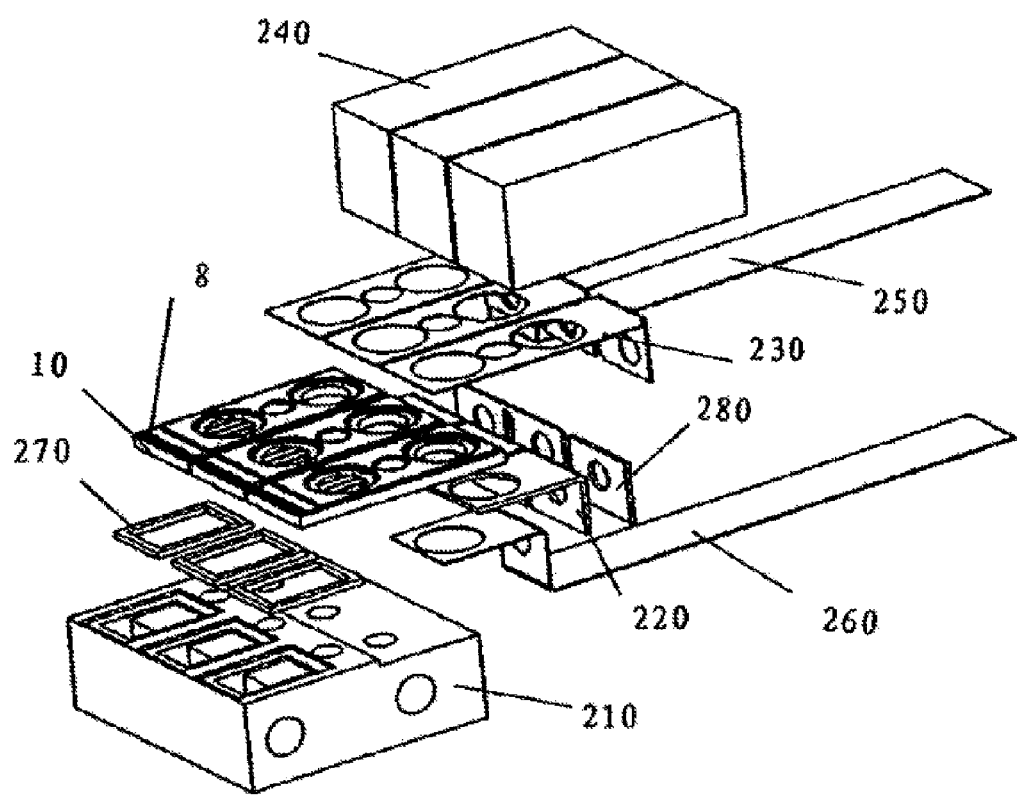
FIG. 9 is a three-dimensional exploded view showing the horizontal array type semiconductor laser according to the present invention.
Figure 10:
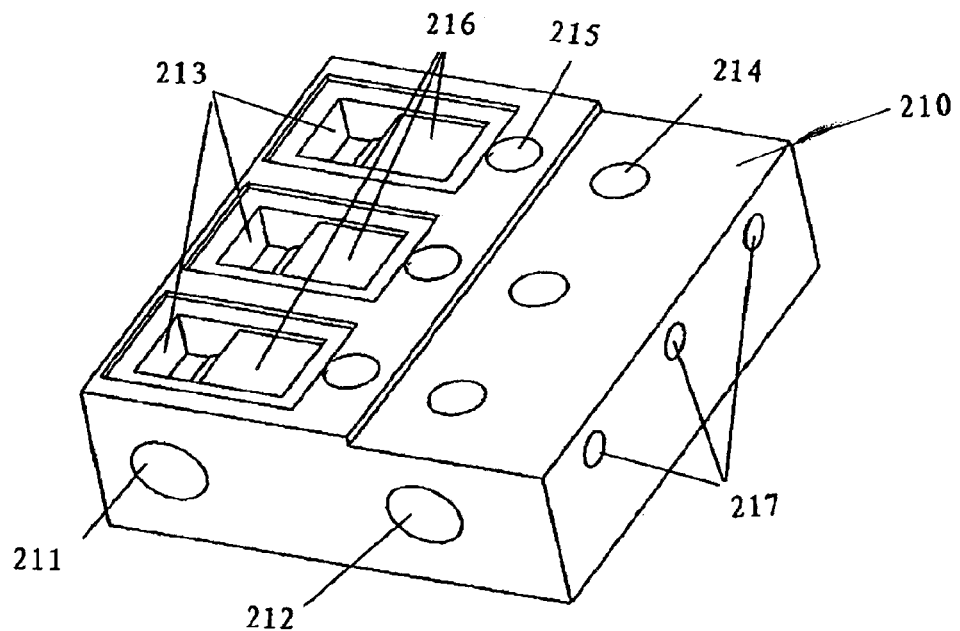
FIG. 10 is a three-dimensional schematic view showing the lower cooling module in the horizontal array type semiconductor laser according to the present invention.

(1) Shown in FIG. 8 is an L-I-V curve of an 808 nm single-array semiconductor laser sample, the highest output light power thereof is 289.45 W.

(2) Under the working condition of a pulse at 250 A (400 Hz, 200 us), the test result of the 808 nm single-array semiconductor laser sample is as shown in FIG. 7. At this time, the laser has a threshold current of 21.35 A, a slope efficiency of 1.31 W/A, and a typical electro-optic conversion efficiency of 59.07%.

(3) The semiconductor laser sample as shown in FIG. 8 is fabricated according to the present invention. It has a wavelength of 808 nm, a power of 250 W by a spectral test result, a peak wavelength of 808.53 nm, a central wavelength of 808.53 nm, an FWHM of 2.73 nm, and an FW90% E of 3.85 nm.

The present invention has changed the micro-channel liquid cooling form employed by traditional semiconductor lasers under the condition of satisfying the requirement of use power. The present invention effectively avoids the deficiencies concerning the processing difficulty and high production cost brought about by processing the micro-channel structure. By the use of fins to dissipate heat, the present invention not only reduces the resistance to circulation flow of the cooling liquid and avoids the defect of unduly large pressure decrease of the cooling liquid, but also greatly reduces the production cost due to the simplified fabrication of the fins. Moreover, the mode of using fins to dissipate heat achieves the same heat dissipating effect as the mode of using the micro-channel structure to dissipate heat. With the cooperation of the upper liquid cooling block and the lower liquid cooling block, the present invention achieves better heat dissipating effect.

Figure 11:
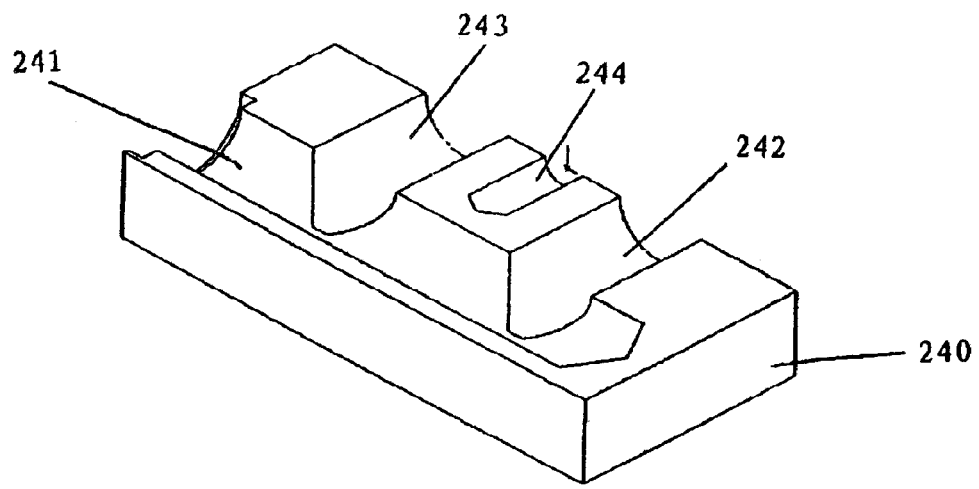
FIG. 11 is a sectional view showing the upper cooling module in the horizontal array type semiconductor laser according to the present invention.
Figure 12:
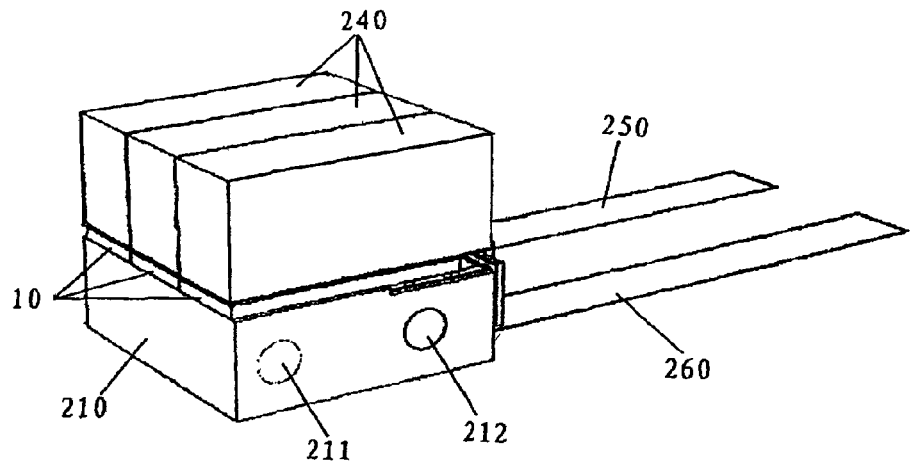
FIG. 12 is a three-dimensional schematic view showing the horizontal array type semiconductor laser according to the present invention.

Referring to FIGS. 9 to 13, a horizontal array type semiconductor laser using the aforementioned cooling module as proposed in the present invention comprises a lower liquid cooling block 210, a positive electrode connection plate 220, a negative electrode connection plate 230, an upper liquid cooling block 240, two or more cooling modules 10 provided with fixing holes 3, liquid inlets 4, liquid outlets 5 and chips 8 arranged in parallel (see FIG. 1), as well as some auxiliary component parts, such as watertight seal rings 270 and bolts or screws as necessary. The lower liquid cooling block 210 is provided therein with a horizontal liquid inlet 211 and a horizontal liquid outlet 212, two or more sets (three sets shown in the drawings) of liquid inlets and outlets are provided at an upper surface of the lower liquid cooling block 210, each set including a vertical liquid inlet 213 and a vertical liquid outlet 214, of which the vertical liquid inlet 213 is communicative with the horizontal liquid inlet 211 of lower liquid cooling block 210, and the vertical liquid outlet 214 is communicative with the horizontal liquid outlet 212 of lower liquid cooling block 210. The two or more cooling modules 10 provided with liquid inlets 4 and liquid outlets 5 are disposed in parallel corresponding to each set of liquid inlets 213 and liquid outlets 214 on the upper surface of the lower liquid cooling block 210. The cooling module liquid inlet 4 and the cooling module liquid outlet 5 of each cooling module 10 are respectively communicative with the vertical liquid inlet 213 and the vertical liquid outlet 214 of each set of liquid inlets and liquid outlets on the lower liquid cooling block 210. A positive electrode connection plate 220 is provided between each cooling module 10 and the lower liquid cooling block 210, and a negative electrode connection plate 230 is provided on each cooling module 10. The upper liquid cooling block 240 is placed on top of the negative electrode connection plate 230. A bolt through-hole 231 matching to the corresponding fixing hole 3 at the middle portion of the cooling module 10 is provided on the negative electrode connection plate 230. A set of perpendicular bolt through-holes 215, matching to the corresponding fixing hole 3 of each cooling module 10, is provided on the lower liquid cooling block 210. A return-liquid communication hole 241 is provided in the upper liquid cooling block 240 (as shown in FIG. 11). The return-liquid communication hole 241 in the upper liquid cooling block 240 is a blind hole whose opening end is usually blocked by a stopper to prevent the cooling liquid from flowing out (not shown in the drawings). A liquid inlet 242 and a liquid outlet 243 are provided on a lower surface of the upper liquid cooling block 240. The liquid inlet 242 of the upper liquid cooling block 240 and the liquid outlet 243 of the upper liquid cooling block 240 are communicative with the return-liquid communication hole 241. A fixing screw hole 244 is further provided on the lower surface of the upper liquid cooling block 240 in a position between the liquid inlet 242 of the upper liquid cooling block 240 and the liquid outlet 243 of the upper liquid cooling block 240. The lower liquid cooling block 210, the cooling module 10 and the negative electrode connection plate 230 are fixed on the upper liquid cooling block 240 via a bolt.

The bolt through-hole 215 on the lower liquid cooling block 210 locates between the vertical liquid inlet 213 and the vertical liquid outlet 214 of each set of liquid inlets and outlets. A step is provided on the lower liquid cooling block 210 at the surface where the vertical liquid outlet 214 is located.

The negative electrode connection plate 230 and the positive electrode connection plate 220, which are respectively provided at the upper or lower sides of each cooling module 10, are both fixed in insulation on the lower liquid cooling block 210. The negative electrode connection plate 230 of each cooling module 10 is connected with the positive electrode connection plate 220 of the adjacent cooling module 10, thus that each set of negative electrode connection plate 230 and positive electrode connection plate 220 at upper or lower sides of each cooling module 10 forms an electrical series connection. The negative electrode connection plate 230 is lead out by a negative electrode leading plate 250, and the positive electrode connection plate 220 is lead out by a positive electrode leading plate 260. The shape of the negative electrode connection plate 230 is designed according to the cooling module 10. Corresponding through-holes are provided on the negative electrode connection plate 230 in a position according to the pattern of the cooling module 10, on which, the liquid inlet 4, the liquid outlet 5, and the fixing hole 3 exist. The positive electrode connection plate 220 is a small piece of metal plate, and is provided with a through-hole corresponding to the liquid outlet 5 of the cooling module 10.

In order to increase the turbulence level of the cooling liquid inside the vertical liquid inlet 213 on the lower liquid cooling plate 210, a sink groove 216 is provided at an upper opening of the vertical liquid inlet 213 on the lower liquid cooling block 210. The sink groove 216 may be set as a rectangular shape, as shown in the drawings, or may be designed in any other shapes upon practical demand The diameter of the sink groove 216 is larger than that of the vertical liquid inlet 213. A seal ring 270 is provided on the sink groove 216. A step is processed at the edge of the sink groove 216, and the seal ring 270 is mounted on this step.

The specific mounting structure of this embodiment is as follows. Two or more (three as shown in the drawings) cooling modules 10 independent from one another are arranged in parallel on the upper surface of the lower liquid cooling block 210 and correspondingly to each set of liquid inlets and outlets on the lower liquid cooling block 210. The positive electrode connection plate 220 is disposed between each cooling module 10 and the lower liquid cooling plate 210, and the negative electrode connection plate 230 is disposed on each cooling module 10. The upper liquid cooling plate 240 is disposed on each negative electrode connection plate 230. The liquid inlet 4 and the liquid outlet 5 of each cooling module 10 are respectively communicative with the vertical liquid inlet 213 and the vertical liquid outlet 214 of each set of liquid inlets and liquid outlets on the lower liquid cooling block 210. At the same time, the liquid inlet 4 and the liquid outlet 5 of each cooling module 10 are also respectively communicative with the upper liquid cooling block liquid inlet 242 and the upper liquid cooling block liquid outlet 243 on the upper liquid cooling plate 240. The sink groove 216 on the vertical liquid inlet 213 of each set of liquid inlets and outlets on the lower liquid cooling block 240 is located below the cooling module 10, and attaches to the liquid cooling plate 2 of the cooling module 10 via the watertight seal ring 270. The positive electrode connection plate 220 is mounted on the step on a surface where the vertical liquid outlet 214 of the lower liquid cooling block 210 is located, and each positive electrode connection plate 220 respectively attaches to the underside of the liquid cooling plate 2 of each cooling module 10. The first positive electrode connection plate 220 is directly connected with the positive electrode leading plate 260, the next positive electrode connection plate 220 is connected with the previous negative electrode connection plate 230, each negative electrode connection plate 230 attaches to the connection plate 1 on each cooling module 10, and each negative electrode connection plate 230 is connected with the next positive electrode connection plate 220, that is to say, each set of negative electrode connection plate 230 and positive electrode connection plate 220 at upper and lower sides of each cooling module 10 forms a serially electrically connected form. The last negative electrode connection plate 230 of the cooling module is directly lead out by the negative electrode leading plate 250. Each positive electrode connection plate 220 and each corresponding negative electrode connection plate 230 are both fixed via bolts on a set of connection plate fixing holes 217 at a side of the lower liquid cooling plate 210, and an insulating plate 280 for insulation is provided between each set of positive electrode connection plate 220 and negative electrode connection plate 230.

The upper liquid cooling block 240, the cooling module 10 and the negative connection plate 230 are fixed via bolts on the lower liquid cooling block 210. Specifically, the bolts pass through the lower end of the screw fixing hole 215 on the lower liquid cooling block 210, then sequentially pass through the bolt through-holes of the cooling module 10 and that of the negative electrode connection plate 230, and are finally screwed into the upper liquid cooling block fixing screw hole 244 at the lower end of the upper liquid cooling block 240. To ensure sealing property, rubber seal rings 13 are provided on both the liquid inlet 4 and the liquid outlet 5 of the cooling module 10 according to the present invention.

The fabrication process of this embodiment is as follows:

(1) Opening holes on the lower liquid cooling block 210, in which the holes' diameters of the lower liquid cooling block horizontal liquid inlet 211 and the lower liquid cooling block horizontal liquid outlet 212 should be made slightly larger than the holes' diameters of the liquid inlet 4 and larger than that of the liquid outlet 5 of the cooling module 10 to ensure stable water flow;

(2) first placing N number of watertight seal rings 270 at the vertical liquid inlet 213 of the lower liquid cooling block 210, then placing the positive electrode connection plate 220 on the lower liquid cooling block 210, and subsequently arranging in parallel thereon N number of cooling modules 10 with chips 8; thereafter, sequentially stacking the negative electrode connection plate 230 and the upper liquid cooling block 240 above the cooling modules 10, clamping the positive electrode leading plate 260 below the outermost positive electrode connection plate 220, and sequentially fixing the positive electrode connection plate 260, the previous negative electrode connection plate 230, the insulating plate 280, and the negative electrode leading plate 230 of the cooling modules 10 to the edge of the lower liquid cooling block 210 in an outward order; wherein the negative electrode connection plate 230 and the positive electrode connection plate 220 are separated from each other by means of the insulating plate 280, and are fixed onto the lower liquid cooling block 210 by means of fixing screws to ensure reliability of the electrical connection. Finally, the entire structure is connected by bolts;

(3) testing, to ensure that various parameters and indices conform to ex-factory qualifications.

The operating procedures of this embodiment are as follows.

Figure 13:
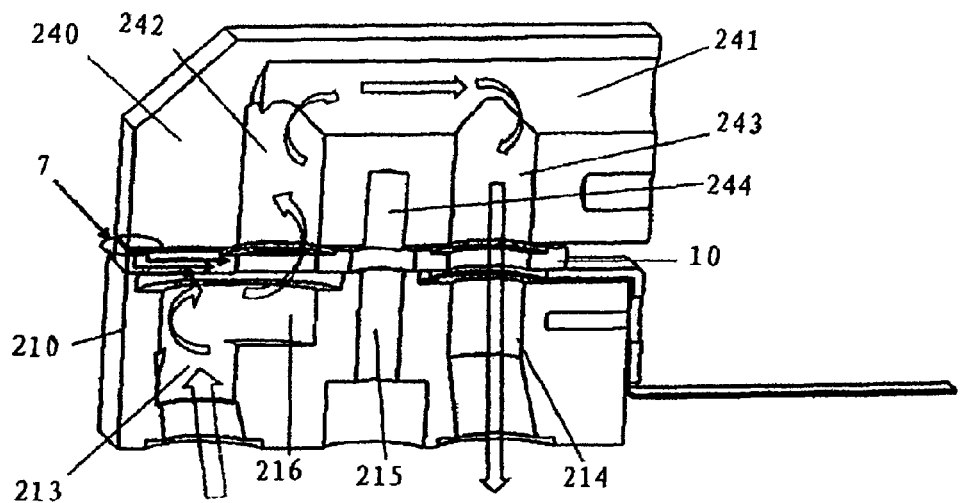
FIG. 13 is a schematic view showing heat dissipation of the horizontal array type semiconductor laser according to the present invention.

A p-n junction semiconductor luminescent material connected at the positive and negative electrodes of the chip 8 is applied with a forward bias, where the p-region is connected to the positive electrode, and the n-region is connected to the negative electrode. The electric field of the forward voltage is reverse in direction to the self-established electric field of the p-n junction, thus weakening the resistance function of the self-established electric field against the diffusion movement of electrons in the crystals, whereby free electrons in the n-region incessantly diffuse through the p-n junction towards the p-region under the action of the forward voltage. Moreover, when great quantities of electrons in the conduction band and holes in the valence band are present in the joint region, they will be compounded in the injection region. When electrons in the conduction band transition to the valence band, redundant energy will be emitted out in the form of light. Heat generated during operation of the laser is dissipated by means of the liquid cooling plate 2 in the cooling module 10. Referring to FIG. 13, the cooling liquid enters via the horizontal liquid inlet 211 of the lower liquid cooling block 210 into each vertical liquid inlet 214, abruptly expands in the sink groove 216, contacts, in a large area, the underside surface of the cooling module 10 where the chip is mounted, then absorbs the heat generated by the operation of the chip 8 from the liquid inlet 4 of each cooling module 10 through the radiating fin 6, subsequently flows upwards into the liquid inlet 242 of the upper liquid cooling block 240, enters each vertical liquid outlet 214 after flowing through the cooling module liquid outlet 5 via the return-liquid communication hole 241 and the liquid outlet 243 of the upper liquid cooling block, and is finally expelled to carry away the heat after converging at the horizontal liquid outlet 212 of the lower liquid cooling block 210.

In comparison with a micro-channel liquid-cooled semiconductor laser array product, the product according to this embodiment greatly reduces the production cost and decreases the thermal resistance on conditions of satisfying the requirements of use power and duty ratio, removes the problem of unduly large pressure decrease of the cooling medium, and guarantees high output power on the precondition of satisfying the demand on beam quality.

The technical solution of this embodiment is neither restricted to what is described above, nor to the structural forms illustrated in the drawings accompanying the Description. Some substitute solutions employable by the present invention are listed as follows.

1. The liquid inlets and outlets of the entire semiconductor laser are not limited to being disposed on the lower liquid cooling block 210, as it is also possible to dispose the liquid inlets on the lower liquid cooling block 210, and to dispose the liquid outlets on the upper liquid cooling block 240.

2. The liquid inlets and outlets on the lower liquid cooling block 210 can be either located at the same side or located at the left and right sides. There can be either only one liquid inlet and one liquid outlet, or more than one liquid inlets and liquid outlets.

3. The cooling liquid passages (such as the vertical liquid inlet, the vertical liquid outlet, the cooling module liquid inlet, and the cooling module liquid outlet, etc.) on the lower liquid cooling block 210 and the cooling module 10 can have any shapes of cross-sections, such as rectangular shape, elliptical shape, and so on.

4. The upper liquid cooling blocks 240 can either be independent from the cooling modules 10, or match the cooling modules 10 on a one-to-one basis, or fix together with the cooling modules 10 into an integrity. The upper liquid cooling block 240 can be made either of a metal or of a non-metallic material.

Referring to FIGS. 14-19, the present invention further provides a stacked array type semiconductor laser using the aforementioned cooling module. The laser comprises a lower bottom plate 310, a positive electrode block 320, a multi-bar serially connected module set 330, a negative electrode block 340, an upper pressing block 350, and a liquid cooling block 360 stacked in the order from bottom up, wherein the multi-bar serially connected module set 330 is formed by sequentially and perpendicularly stacking a plurality of cooling modules 10 (see FIG. 1) having chips 8 and provided with liquid inlets 4 and liquid outlets 5.

The liquid inlets 4 and liquid outlets 5 on the cooling modules 10 form a liquid inflow passage 331 and a liquid outflow passage 332 of the multi-bar serially connected module set, and the liquid inflow passage 331 and the liquid outflow passage 332 are perpendicular to planes of the cooling modules 33 having chips. Radiating fins 6 are provided at intervals within passages inside the liquid inflow passage 331.

The positive electrode block 320 is provided with a liquid inlet 321 and a liquid outlet 322 thereon, and with a through-hole 323 interposed therebetween. The negative electrode block 340 is correspondingly provided with a liquid inlet 341 and a liquid outlet 342. The upper pressing block 350 is provided with a liquid inlet 351 and a liquid outlet 352 thereon. The liquid cooling block 360 is provided with a liquid inlet 361 and a liquid outlet 362 thereon. The positive electrode block liquid inlet 321, the liquid inflow passage 331, the negative electrode block liquid inlet 341, the liquid inflow passage 351, and the liquid cooling block liquid inlet 361 are sequentially communicative with one another, and the positive electrode block liquid outlet 322, the liquid outflow passage 332, the negative electrode block liquid outlet 342, the liquid outflow passage 352, and the liquid cooling block liquid outlet 362 are sequentially communicative with one another. The lower bottom plate 310 is correspondingly provided with a liquid inlet 311 and a liquid outlet 312. Side plates 313 are provided at both sides of the lower bottom plate. The positive electrode block 320, the multi-bar serially connected module set 330 and the negative electrode block 340 are sequentially stacked and mounted and thereafter arranged between the two side plates 313 standing on the lower bottom plate 310. The cooling module 10 at the bottom of the multi-bar serially connected module set 330 closely attaches to the positive electrode block 320, and the lower ports of the liquid inflow passage 331 and the liquid outflow passage 332 are respectively connected via seal rings with the positive electrode block liquid inlet 321 on the positive electrode block 320 and the upper port of the positive electrode block liquid outlet 322.

The upper pressing block 350 is disposed at the upper side of the negative electrode block 340 and is fixedly connected with the upper ends of the two side plates 313 of the lower bottom plate 310. An upper side face of the upper pressing block 350 is fixedly connected with the liquid cooling block 360.

Figure 15:
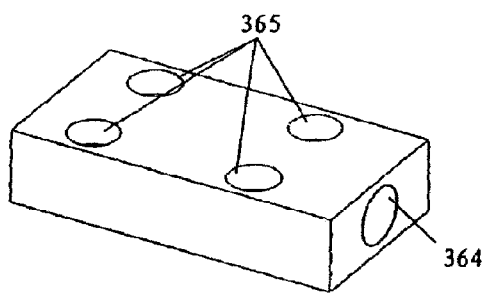
FIG. 15 is a three-dimensional schematic view showing the liquid cooling block in the stacked array type semiconductor laser according to the present invention.
Figure 16:
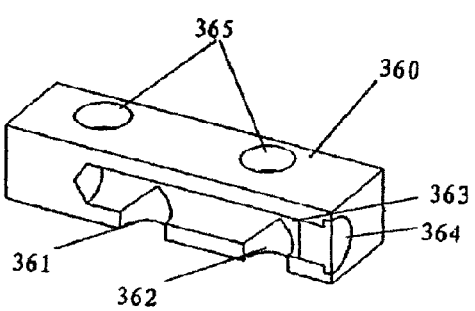
FIG. 16 is a sectional view showing the liquid cooling block in the stacked array type semiconductor laser according to the present invention.
Figure 18:
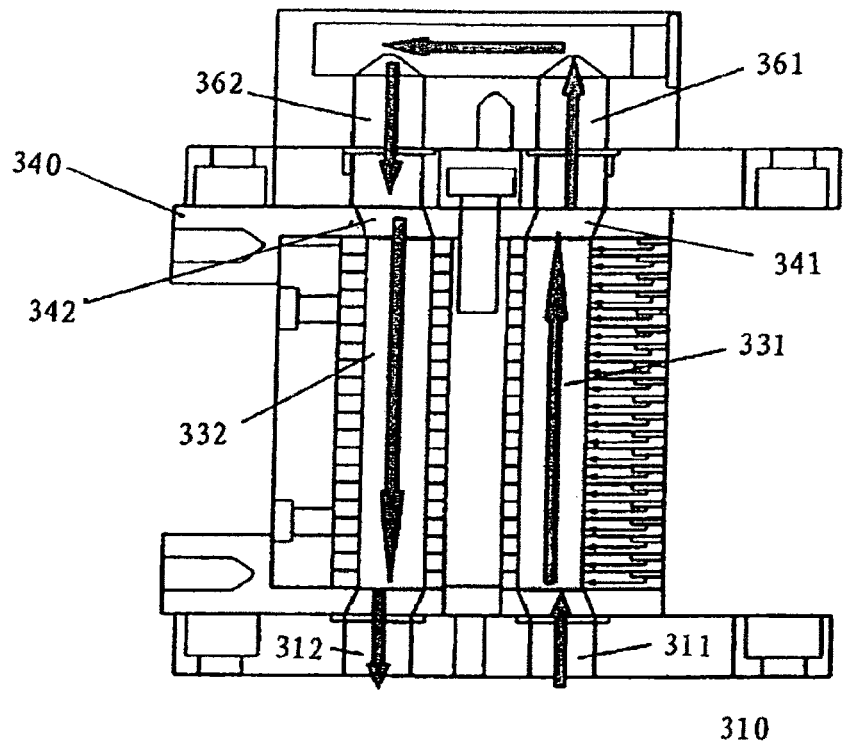
FIG. 18 is a sectional schematic view showing the flow direction of the cooling liquid passage of the stacked array type semiconductor laser according to the present invention.

The structure of the liquid cooling block 360 is shown in FIGS. 15 and 16. A conduction hole 363 is disposed in the liquid cooling block 360, and a liquid cooling block liquid inlet 361 and a liquid cooling block liquid outlet 362 are provided at a lower surface of the liquid cooling block 360. The liquid cooling block liquid inlet 361 and the liquid cooling block liquid outlet 362 are communicative with each other via the conduction hole 363, which is a blind hole having a stopper 364 provided at its opening. Thus, the liquid inflow passage 331, the conduction hole 363 and the liquid outflow passage 332 of the multi-bar serially connected module set 330 form a cooling medium circulation loop (as shown in FIG. 18).

The lower ports of the liquid inlet 351 and the liquid outlet 352 of the upper pressing block 350 are connected via seal rings with the upper ports of the negative electrode block liquid inlet 341 and the negative electrode block liquid outlet 342 on the negative electrode block 340. The shape of the negative electrode block 340 is same as the shape of the positive electrode block 320, and the lower surface of the negative electrode block 340 attaches to the connection plate 1 of the cooling module 10 at the top of the multi-bar serially connected module set 330. The negative electrode block liquid inlet 341 and the negative electrode block liquid outlet 342 are also respectively connected via seal rings with the liquid inflow passage 331 and the liquid outflow passage 332.

An H-shaped rear plate 380 is fixedly connected to the side of the two side plates 313 of the lower bottom plate 310, which is farer from a light emitting surface of the multi-bar serially connected module set 330. The H-shaped rear plate 380 is fixed on the side plate 313 via a bolt by means of a rear plate fixing hole 381 disposed thereon. The lower bottom plate 310, the positive electrode block 320, the multi-bar serially connected module set 330, the negative electrode block 340 and the upper pressing block 350 are connected together with the liquid cooling block 360 in the form of a stacked array via a bolt 370 centrally passing therethrough, thus forming a complete liquid cooling closed loop.

The specific fabrication method according to the present invention is described in more details below:

1) processing connection holes 354 and 365 on the upper pressing block 350 and the liquid cooling block 360;

2) fixedly fastening the H-shaped rear plate 380 via a bolts onto the two side plates 313 of the bottom plate 310 through the fixing hole 381;

3) coating an insulating layer on the lower surface of the positive electrode block 320, the side plates 313 and the H-shaped rear plate 380; placing the positive electrode block 320 between the two side plates 313 of the bottom plate 310, attaching one face of the insulating layer to the liquid inlet 311 of the lower bottom plate 310, and using seal rings to seal the upper and lower sides of the liquid inlet 321 and the liquid outlet 322 of the positive electrode block 320;

4) stacking a plurality of cooling modules 10 with chips in the perpendicular direction to form the multi-bar serially connected module set 330, placing the bottom end of the liquid cooling plate 2 of the lowermost cooling module 10 on the positive electrode block 320 having a seal ring, and abutting the entire multi-bar serially connected module set 330 against the rear plate 380;

5) coating an insulating layer on the upper surface of the negative electrode plate 340, and placing the negative electrode block 340 on the copper connection plate 1 disposed on the top multi-bar serially connected module set 330;

6) placing the upper pressing block 350 on the negative electrode block 340, and using the through-bolt 370 to fixedly connect together the upper pressing block 350, the negative electrode block 340, the multi-bar serially connected module set 330, the positive electrode block 320, and the lower bottom plate 310;

7) using screws to fasten together the upper pressing block 350 with the two side plates 313 of the lower bottom plate 310 via a connection screw 353 and a side plate fixing screw 314;

8) fixedly connecting the liquid cooling block 360 with a fixing screw 354 on the upper pressing block 350 via the connection hole 365.

Figure 17:
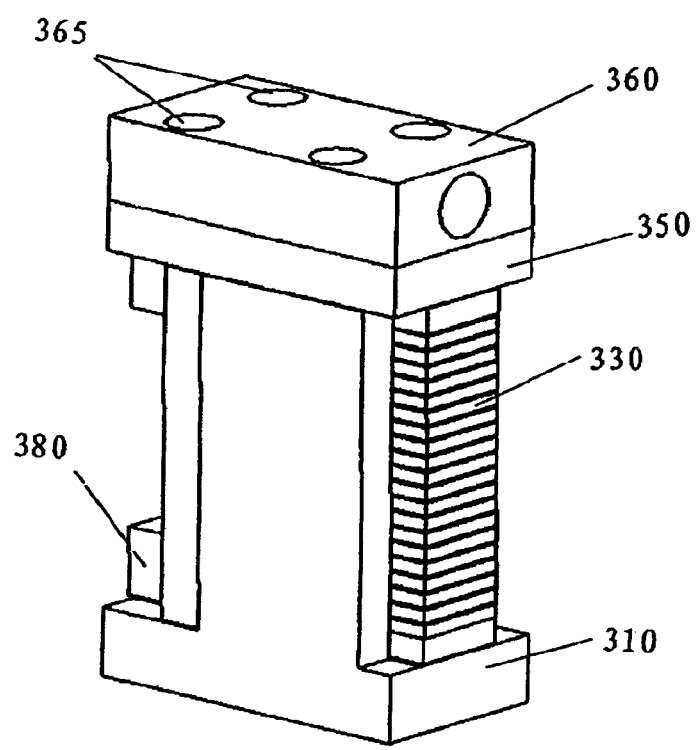
FIG. 17 is a three-dimensional view showing assembly of the stacked array type semiconductor laser according to the present invention.

Finally as shown in FIG. 17, the entire stacked array is assembled from bottom to the top to become a complete stacked array type liquid-cooled semiconductor laser.

The operating procedures of the stacked array type liquid-cooling semiconductor laser according to this embodiment are described in more details below.

As shown in FIG. 18, during operation, the liquid cooling plate 2 and the connection plate 1 of each cooling module 10 with a chip are applied with voltage. Since the p-region of the chip 8 is connected with the liquid cooling plate 2 and the n-region thereof is connected with the connection plate 1, the p-n junction semiconductor material of the chip 8 is applied with a forward bias. The electric field of the forward voltage is reverse in direction to the self-established electric field of the p-n junction, thus weakening the resistance function of the self-established electric field against the diffusion movement of electrons in the crystals, whereby free electrons in the n-region incessantly diffuse through the p-n junction towards the p-region under the action of the forward voltage. Moreover, when great quantities of electrons in the conduction band and holes in the valence band are present in the joint region, they will be compounded in the injection region. When electrons in the conduction band jump up to the valence band, redundant energy will be emitted out in the form of light. The light emitted from each cooling module 10 with a chip is from the lateral direction of the chip 8.

The chip 8 generates great amount of heat during the process of operation, and circulatory flow of the cooling liquid as described below is necessary to cool the chip 8.

The cooling liquid enters from the liquid inlet 311 of the lower bottom plate 310, and passes through the liquid inlet 321 of the positive electrode block 320 into the liquid inflow passage 331 of the multi-bar serially connected module set 330 to carry away the heat from the radiating fins 6 in the liquid inflow passage 331. After flowing out of the liquid inflow passage 331, the cooling liquid passes through the liquid inlet 341 of the negative electrode block 340 and the liquid inlet 351 of the upper pressing block 350 into the liquid inlet 361 of the liquid cooling block 360, is guided by the conduction hole 363 to enter the liquid cooling block liquid outlet 362, thereafter leaves the liquid cooling block 360, enters the liquid outflow passage 332 of the multi-bar serially connected module set 330 through the liquid outlet 352 of the upper pressing block 350 and the negative electrode block liquid outlet 342, and reenters the liquid outlet 322 of the positive electrode block 320 to flow out of the liquid outlet 312 at the lower end of the lower bottom plate 310. After passing through a water cooler, the cooling liquid reenters the liquid inlet at the lower end of the lower bottom plate 310, thus realizing the circulatory cooling function of cooling liquid.

Figure 14:
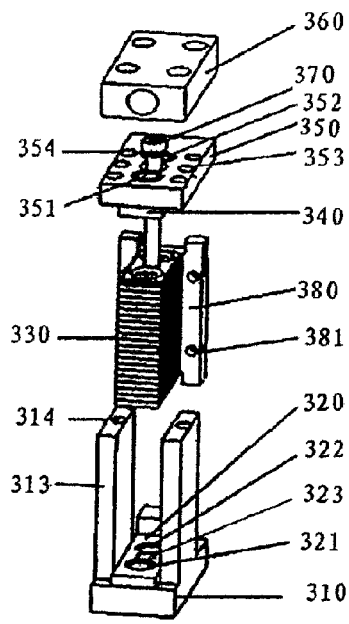
FIG. 14 is a three-dimensional exploded view showing the stacked array type semiconductor laser according to the present invention.
Figure 19:
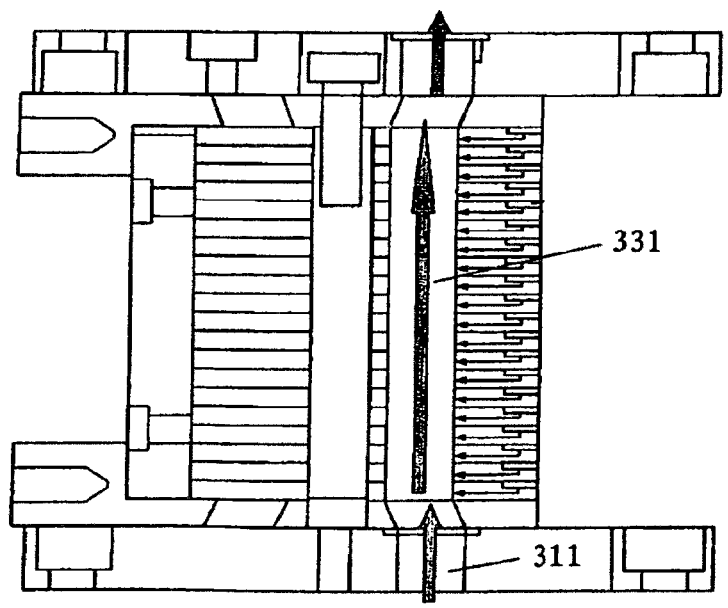
FIG. 19 is a sectional schematic view showing a alternative solution for the cooling liquid passage of the stacked array type semiconductor laser according to the present invention.

The cooling liquid of the laser cooling internal circulation pipe as shown in FIG. 14 or 17 or 18 flows in from the liquid pipe inlet 311 at the lower end of the lower bottom plate 310 and flows out of the liquid outlet 312 of the lower bottom plate 310. However, the present invention is not restricted to this one solution, but it is also possible to provide the liquid inlet of the cooling liquid on the lower bottom plate, and to provide the liquid outlet on the liquid cooling block 360, as shown in FIG. 19. In addition, the circulatory flowing direction of the cooling liquid can also be in from above while out from below.

In summary, besides simple fabrication and low production cost, after replacement of the traditional micro-channel structure with the radiating fin structure, the present invention effectively reduces the resistance to flow of the cooling liquid, remarkably lowers the pressure decrease of the cooling liquid, makes it easier to seal the cooling liquid, provides stronger heat dissipating capability, effectively elongates the lifetime of the semiconductor laser, and enhances the output power and reliability of the semiconductor laser.

The above is merely descriptive of preferred embodiments of the present invention, rather than restrictive of the present invention in whichever form. Although the present invention has been disclosed with the aforementioned preferred embodiments, these are not meant to restrict the present invention. Any person skilled in the art may make use of the technical contents disclosed above to make slight variations or modifications as equivalent embodiments without departing from the scope of the technical solution of the present invention. However, any such simple amendments, equivalent variations and modifications made to the aforementioned embodiments according to the technical substance of the present invention and without departing from the technical solution of the present invention shall be covered by the scope of the technical solution of the present invention.

What is claimed is:

1. A horizontal array type semiconductor laser, comprising a lower liquid cooling block, a positive electrode connection plate, a negative electrode connection plate, an upper liquid cooling block, and two or more cooling modules provided with fixing holes, liquid inlets, liquid outlets and chips arranged in parallel;

wherein at least one of the two or more cooling modules comprises a connection plate and a liquid cooling plate, wherein fixing holes are provided perpendicularly at central portions of the connection plate and the liquid cooling plate, liquid inlets and liquid outlets are provided respectively at both adjacent sides of the fixing holes, a radiating fin is provided inside the liquid inlet of the liquid cooling plate, a chip mounting area is provided at one end of the liquid cooling plate close to the liquid inlet thereof, a heat sink and a chip are provided at the chip mounting area of the liquid cooling plate, the heat sink attaches to a positive electrode surface of the chip, a negative electrode surface of the chip attaches to the connection plate, and an insulating plate is further provided between the connection plate and the liquid cooling plate; and wherein the lower liquid cooling block is provided therein with a lower liquid cooling block horizontal liquid inlet and a lower liquid cooling block horizontal liquid outlet, two or more sets of liquid inlets and outlets are provided at an upper surface of the lower liquid cooling block, each set including a vertical liquid inlet and a vertical liquid outlet, the vertical liquid inlet being communicative with the horizontal liquid inlet of the lower liquid cooling block, and the vertical liquid outlet being communicative with the horizontal liquid outlet of the lower liquid cooling block; the two or more cooling modules provided with liquid inlets and liquid outlets are disposed in parallel corresponding to each set of liquid inlets and liquid outlets on the upper surface of the lower liquid cooling block, and the cooling module liquid inlet and the cooling module liquid outlet of each cooling module are communicative with the vertical liquid inlet and the vertical liquid outlet of each set of liquid inlets and liquid outlets on the lower liquid cooling block, a positive electrode connection plate is provided between each cooling module and the lower liquid cooling block, a negative electrode connection plate is provided on each cooling module, and the upper liquid cooling block is disposed on the negative electrode connection plate; the negative electrode connection plate is provided with a bolt through-hole in a position corresponding to the fixing hole at a middle portion of the cooling module; a the lower liquid cooling block is provided with a set of perpendicular bolt through-holes in a position corresponding to the fixing holes at each cooling module; a return-liquid communication hole is provided in the upper liquid cooling block; an upper liquid cooling block liquid inlet and an upper liquid cooling block liquid outlet are provided on a lower surface of the upper liquid cooling block; the upper liquid cooling block liquid inlet and the upper liquid cooling block liquid outlet are communicative with the return-liquid communication hole; a fixing screw hole is further provided on the lower surface of the upper liquid cooling block; and the lower liquid cooling block, the cooling module and the negative electrode connection plate are fixed on the upper liquid cooling block via a bolt.

2. The horizontal array type semiconductor laser, as recited in claim 1, wherein the negative electrode connection plate and the positive electrode connection plate, which are respectively provided at the upper and lower sides of each cooling module, are both fixed in insulation on the lower liquid cooling block, wherein the negative electrode connection plate of each cooling module is connected with the positive electrode connection plate of the adjacent cooling module, thus that each set of negative electrode connection plate and positive electrode connection plate at upper and lower sides of each cooling module forms a serially electrically connected form, the negative electrode connection plate being lead out by a negative electrode leading plate, and the positive electrode connection plate being lead out by a positive electrode leading plate.

3. The horizontal array type semiconductor laser, as recited in claim 2, wherein an enlarged rectangular sink groove is provided at an upper opening of the vertical liquid inlet on the lower liquid cooling block, and a liquid-tight seal ring is provided on the sink groove.

4. The horizontal array type semiconductor laser, as recited in claim 3, wherein the liquid cooling plate of the cooling module, having a thickness of 1.6 mm, is made of metal, ceramic, diamond, or a composite material of copper and diamond.

5. The horizontal array type semiconductor laser, as recited in claim 3, wherein the fixing hole of the cooling module has a diameter of 3.5 mm; the liquid inlet of the cooling module has a diameter of 5.5 mm; and the liquid outlet of the cooling module has a diameter of 5.5 mm.

6. The horizontal array type semiconductor laser, as recited in claim 3, wherein the radiating fin of the liquid cooling plate is a plurality of metal leaves or honeycomb-shaped liquid cooling checks fixed in the liquid inlet.

7. The horizontal array type semiconductor laser, as recited in claim 3, wherein the cooling module has a seal ring provided on an upper end of the liquid inlet of the liquid cooling plate.

* * * * *